US006879517B2

(12) United States Patent
Geren et al.

(10) Patent No.: US 6,879,517 B2
(45) Date of Patent: Apr. 12, 2005

(54) BATTERY CIRCUIT WITH THREE-TERMINAL MEMORY DEVICE

(75) Inventors: Michael D. Geren, Suwanee, GA (US); Joseph Patino, Pembroke Pines, FL (US)

(73) Assignee: Motorola, Inc., Schaumburg, IL (US)

(*) Notice: Subject to any disclaimer, the term of this patent is extended or adjusted under 35 U.S.C. 154(b) by 0 days.

(21) Appl. No.: 10/247,160

(22) Filed: Sep. 18, 2002

(65) Prior Publication Data

US 2004/0052109 A1 Mar. 18, 2004

(51) Int. Cl.[7] ............................................. G11C 16/00
(52) U.S. Cl. ................... 365/185.01; 365/226
(58) Field of Search .................. 365/185.01, 185.05, 365/63, 226

(56) References Cited

U.S. PATENT DOCUMENTS

| 5,926,429 | A  | * | 7/1999 | Saitoh et al. ............... 365/222 |
| 6,054,843 | A  |   | 4/2000 | Oglesbee .................... 320/116 |
| 6,108,249 | A  | * | 8/2000 | Hayashi et al. ............. 365/194 |
| 6,122,215 | A  | * | 9/2000 | Ohsawa ...................... 365/226 |
| 6,246,626 | B1 | * | 6/2001 | Roohparvar ................ 365/226 |
| 6,515,919 | B1 | * | 2/2003 | Lee ............................. 365/192 |

* cited by examiner

*Primary Examiner*—Tan T. Nguyen
(74) *Attorney, Agent, or Firm*—Philip H. Burrus, IV

(57) ABSTRACT

This invention includes a memory device having exactly three external terminals: a power external terminal; a ground or return external terminal; and a one-wire data communication external terminal. The memory is preferably employed in a rechargeable battery pack having exactly four terminals. The power external terminal is coupled to a battery terminal traditionally used for a thermistor. When a host device desires to read data from the memory, the host device closes a switch coupled between a power source and the thermistor battery terminal, thereby actuating the memory. The host then reads data by way of a communication channel established between a microprocessor in the host device and the data communication external terminal of the memory.

4 Claims, 2 Drawing Sheets

BATTERY CIRCUIT WITH THREE-TERMINAL MEMORY DEVICE

BACKGROUND

1. Technical Field

This invention relates generally to rechargeable batteries having associated memory circuits, and more particularly to rechargeable battery circuits having a multiplexed, three terminal memory.

2. Background Art

Electronic memory devices have been around for many decades now. They come in many forms. One very popular type of memory is the electrically programmable read-only memory (EPROM). This device is a non-volatile, transistor based memory that is electrically programmable. The "non-volatile" feature means that an EPROM will retain data even after its power source has been removed. While older memory devices were programmed by physically blowing specific transistors, an EPROM is capable of being programmed electronically. Typically a microprocessor "writes" to the device to program, or store data in, the device.

EPROM devices, generally speaking, are known in the art. For example, U.S. Pat. Nos. 5,483,094, 5,498,560, 5,543,339, 5,554,869, 5,616,941, and 5,621,233, all assigned to Motorola, Inc., teach how to make and use the silicon die and circuitry used with such devices. These patents are incorporated herein by reference.

Another popular memory device is the electrically erasable, programmable, read-only memory (EEPROM). This type of memory is a transistor based, overwritable, non-volatile memory. The "overwritable" feature means that the information stored in the EEPROM may be erased and overwritten. EEPROMS use very similar circuitry to EPROMS. They simply have the added feature of being electrically eraseable. EEPROM devices, generally speaking, are known in the art. For example, U.S. Pat. Nos. 4,479,203, 5,034,922, and 6,438,030, all assigned to Motorola, Inc., teach how to make and use the silicon die and circuitry used with such devices. These patents are incorporated herein by reference. (While the discussion herein after will refer to EPROMs, it will be understood by those of ordinary skill in the art that EEPROMs may be substituted for EPROMs when the writable functionality is required.)

Traditionally, EPROM devices included more than 4 pins. There was a plurality of data pins, as well as power, ground and a clock pin. Dallas Semiconductor greatly simplified the structure of EPROM by developing their "one-wire interface". The one-wire interface is a two pin EPROM. One pin is used for power and data. The other pin is used as ground. One example of such a device is the DS2502 one-wire EPROM. The data sheet for this part may be found by way of the Internet at the address: http://dbserv.maxim-ic.com/quick view2.cfm.?qv pk=2924. (An example of an EEPROM is DS2433 4 k-bit one-wire EPROM. http://dbserv.maxim-ic.com/quick view2.cfm.?qv pk=2915.) The one wire structure is taught in several patents assigned to Dallas Semiconductor, including U.S. Pat. Nos. 5,210,846, 5,398,326, 5,809,518, 5,864,872, and 6,108,751. These data sheets and patents are incorporated herein by reference.

Many creative applications have been developed for EPROM devices like the DS2502. For example, U.S. Pat. No. 6,054,843, entitled "High Speed Battery Charging System with High Accuracy Voltage Sensing," assigned to Motorola, teaches a rechargeable battery pack having such a device. This patent is incorporated herein by reference. While this application works well, there is constant pressure on designers of such battery packs to reduce costs. It would thus be advantageous to have an improved battery circuit with memory with a lower cost.

DETAILED DESCRIPTION OF THE INVENTION

Figure 1:
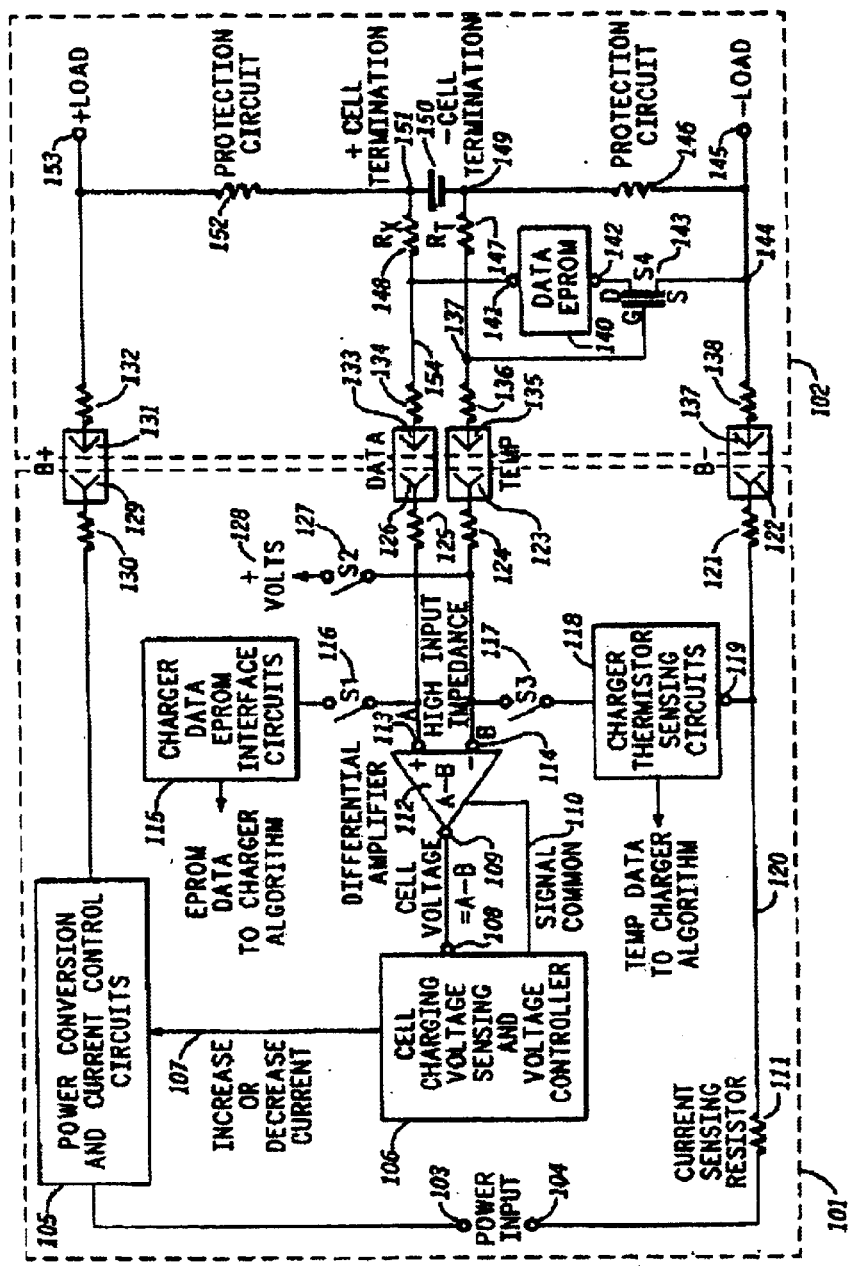
FIG. 1 illustrates the prior art circuit of U.S. Pat. No. 6,054,843.

A preferred embodiment of the invention is now described in detail. Referring to the drawings, like numbers indicate like parts throughout the views. As used in the description herein and throughout the claims, the following terms take the meanings explicitly associated herein, unless the context clearly dictates otherwise: the meaning of "a," "an," and "the" includes plural reference, the meaning of "in" includes "in" and "on."

Referring now to FIG. 1, illustrated therein is the prior art circuit of U.S. Pat. No. 6,054,843 mentioned above. Note that the memory device 140 is a two terminal device, with a data/power terminal 141 coupled to a data terminal 133. The ground terminal 142 coupled to the ground node 144. Switch S2 127 actuates the memory device 140 by coupling power 128 to transistor S4 143. The two-terminal memory device 140 derives "parasitic" power from the data line, as is taught in the Dallas Semiconductor patents mentioned above.

Figure 2:
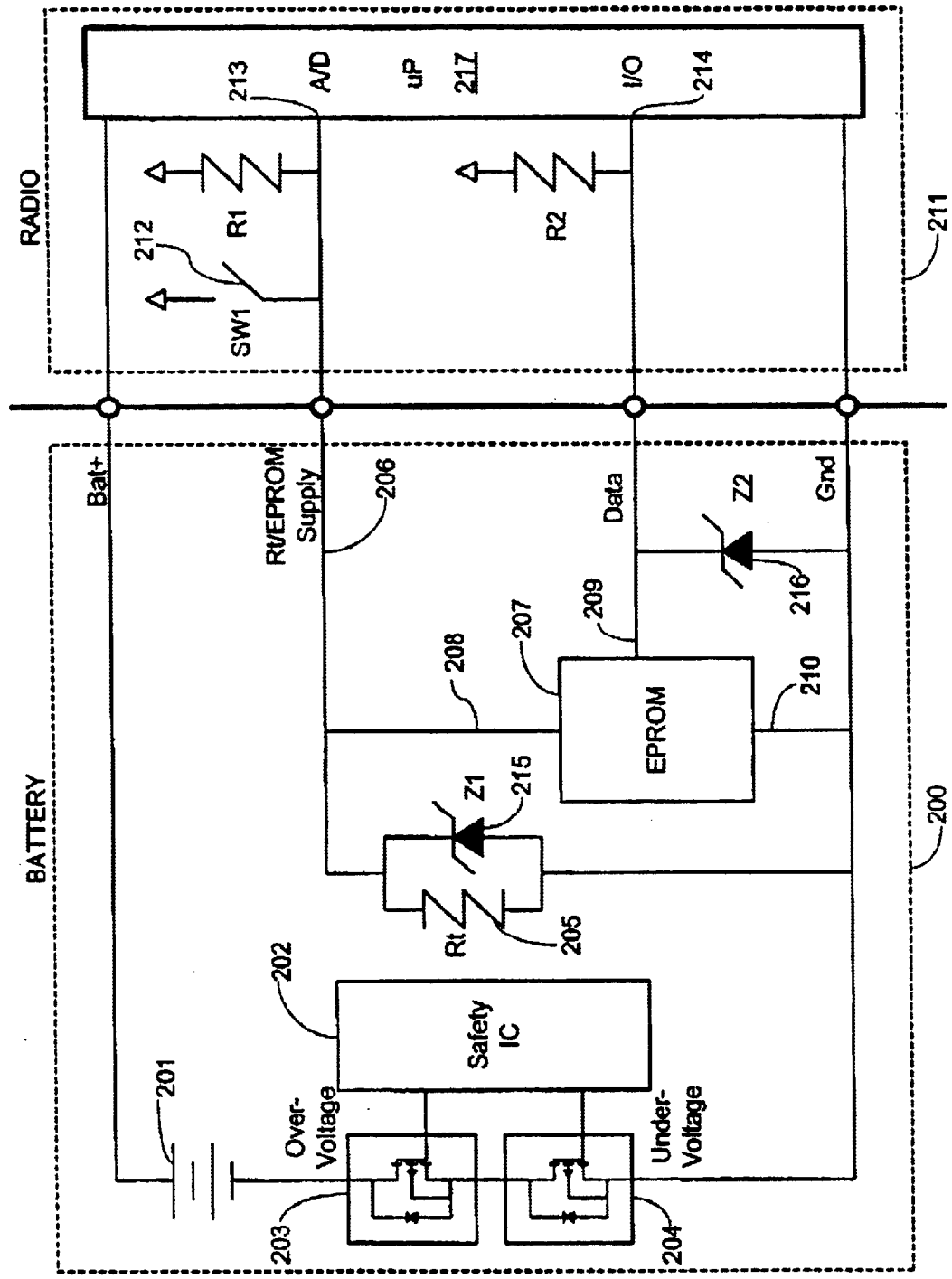
FIG. 2 illustrates a schematic diagram in accordance with the invention

The present invention facilitates similar multiplexing of a memory device, but with a different memory device and schematic configuration. Referring now to FIG. 2, illustrated therein is a schematic diagram in accordance with the invention. A battery 200 is provided. The battery comprises a rechargeable cell 201, a safety circuit 202 and charge and discharge transistors 203,204. A thermistor 205 is included for sensing temperature. The thermistor 205 is coupled to the thermistor terminal 206.

The memory device 207 has exactly three external terminals: power 208, data 209 and ground 210. Note that "external terminals" as used herein with respect to the memory device 207 refers to external connections from the silicon die and circuitry of the memory to other components. The number of external terminals is not necessarily equivalent to the number of pins coupled to the device, as any number of "no connect pins" may be added to create, for example, an 8-pin, 3-external terminal device. The number of external terminals does correspond to a subset of internal nodes of the device.

The data external terminal 209 communicates with a microprocessor 217 in a host device 211 by way of a single wire data communication. Examples of such a single wire communication system are recited in the Dallas Semiconductor patents listed above, and in U.S. Pat. No. 6,300,743, entitled "Single Wire Radio to Charger Communications Method", assigned to Motorola, which is incorporated herein by reference.

The power external terminal 208 is coupled to the thermistor terminal 206. Power is applied to the memory device 207 when the microprocessor 217 closes switch 212. When switch 212 is open, an on-board analog to digital converter (A/D) 213 is able to determine the temperature of the battery by conventional means. When the switch 212 is closed, power is applied to the memory device 207, thereby allowing data to be written or read from an input/output (I/O) port of the microprocessor 214. Two zener diodes 215, 216 provide protection for the memory device 207 during overvoltatge conditions.

The advantage to the three external terminal memory device 207 and circuitry configuration is that it allows the rechargeable battery pack to be manufactured less expensively. The parasitic power data technology referenced in the Dallas patents is quite expensive. By using a three external terminal device, parasitic power is no longer needed. A device having exactly three external terminals is important, however. If more external terminals were included with the memory device, additional battery terminals would be required, thereby adding cost. As most host devices, including phones, radios, pagers and computers, have been designed with four terminals, the present invention offers a lower cost solution over the prior art without the need of additional battery terminals.

While the preferred embodiments of the invention have been illustrated and described, it is clear that the invention is not so limited. Numerous modifications, changes, variations, substitutions, and equivalents will occur to those skilled in the art without departing from the spirit and scope of the present invention as defined by the following claims.

What is claimed is:

1. A battery comprising:
   a. exactly four battery terminals;
   b. a rechargeable battery cell coupled to a first and a second battery terminals;
   c. protection circuitry coupled to the rechargeable battery cell; and
   d. a memory device comprising:
      i. a silicon die and memory circuitry; and
      ii. exactly three terminals, wherein each terminal comprises a single pin, wherein:
         1. a first external terminal is coupled to a power node;
         2. a second external terminal is coupled to a data communication node; and
         3. a third external terminal is coupled to a ground node;
      iii. wherein the type of memory is selected from the group consisting of EPROMs and EEPROMs; wherein
      i. the first external terminal is coupled to a third battery terminal;
      ii. the second external terminal is coupled to a fourth battery terminal; and
      iii. the third external terminal is coupled to the second battery terminal.

2. The battery of claim 1, further comprising a thermistor coupled between the second and third battery terminals.

3. The battery of claim 2, further comprising a zener diode coupled between the second and third battery terminals.

4. A portable electronic system, comprising:
   a. the battery of claim 1; and
   b. a portable electronic host device, wherein the portable electronic host device comprises:
      i. a microprocessor having an A/D converter and an I/O port; and
      ii. a switch coupled to the A/D converter;
wherein when the battery is coupled to the portable electronic host device and switch is closed, a communication channel is established between the second external terminal and the I/O port.

* * * * *